United States Patent
Sandhu et al.

(10) Patent No.: US 8,080,460 B2
(45) Date of Patent: Dec. 20, 2011

(54) METHODS OF FORMING DIODES

(75) Inventors: Gurtej S. Sandhu, Boise, ID (US);
Bhaskar Srinivasan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 599 days.

(21) Appl. No.: 12/323,978

(22) Filed: Nov. 26, 2008

(65) Prior Publication Data
US 2010/0129980 A1 May 27, 2010

(51) Int. Cl.
*H01L 21/8222* (2006.01)
(52) U.S. Cl. .......................... 438/328; 438/237
(58) Field of Classification Search .............. 438/237, 438/328
See application file for complete search history.

(56) References Cited

U.S. PATENT DOCUMENTS

| | | | |
|---|---|---|---|
| 3,651,384 A | 3/1972 | Waters et al. | |
| 4,009,481 A | 2/1977 | Reindl | |
| 6,127,251 A * | 10/2000 | Gardener et al. | 438/585 |
| 6,350,628 B1 | 2/2002 | Cheng et al. | |
| 7,160,745 B2 | 1/2007 | Ulmer et al. | |
| 2002/0020053 A1 | 2/2002 | Fonash et al. | |
| 2002/0113321 A1 | 8/2002 | Siniaguine | |
| 2004/0201057 A1 | 10/2004 | Lien et al. | |
| 2005/0062074 A1 | 3/2005 | Lung | |
| 2007/0040957 A1 | 2/2007 | Chou | |
| 2008/0169464 A1 | 7/2008 | Gong et al. | |
| 2009/0315074 A1 * | 12/2009 | Wang et al. | 257/190 |

FOREIGN PATENT DOCUMENTS

| | | |
|---|---|---|
| JP | 59171174 | 9/1984 |
| JP | 1154034 | 6/1989 |
| JP | 6302608 | 10/1994 |
| WO | PCTUS2009062358 | 6/2010 |

* cited by examiner

*Primary Examiner* — N Drew Richards
*Assistant Examiner* — Jae Lee
(74) *Attorney, Agent, or Firm* — Wells St. John P.S.

(57) ABSTRACT

Some embodiments include methods of forming diodes. A stack may be formed over a first conductive material. The stack may include, in ascending order, a sacrificial material, at least one dielectric material, and a second conductive material. Spacers may be formed along opposing sidewalls of the stack, and then an entirety of the sacrificial material may be removed to leave a gap between the first conductive material and the at least one dielectric material. In some embodiments of forming diodes, a layer may be formed over a first conductive material, with the layer containing supports interspersed in sacrificial material. At least one dielectric material may be formed over the layer, and a second conductive material may be formed over the at least one dielectric material. An entirety of the sacrificial material may then be removed.

35 Claims, 12 Drawing Sheets

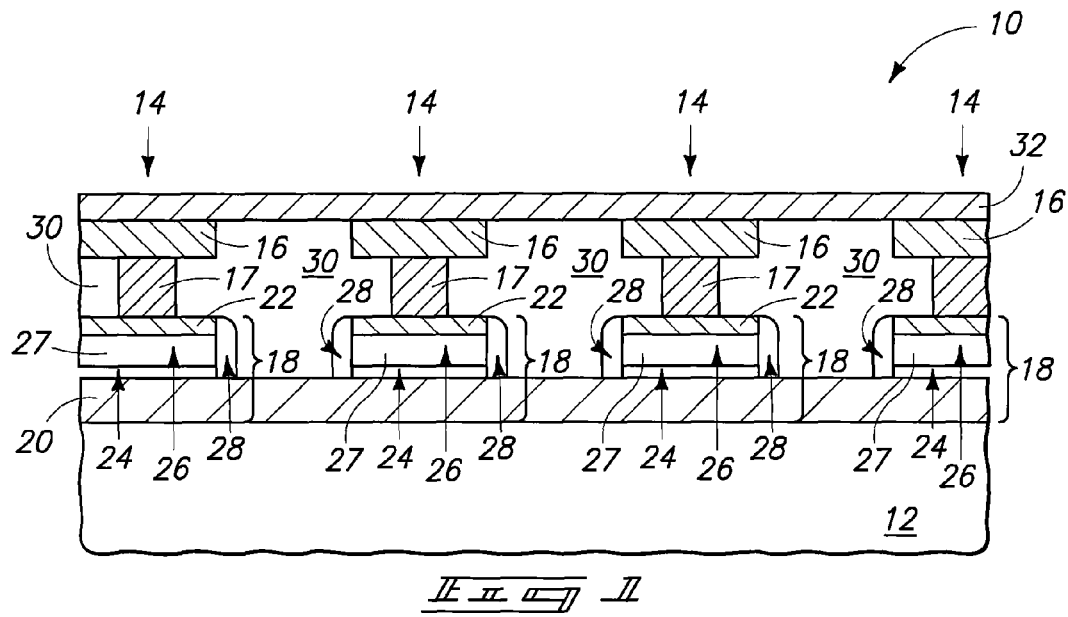
$F_{I\_G}$ $\mathbb{1}$
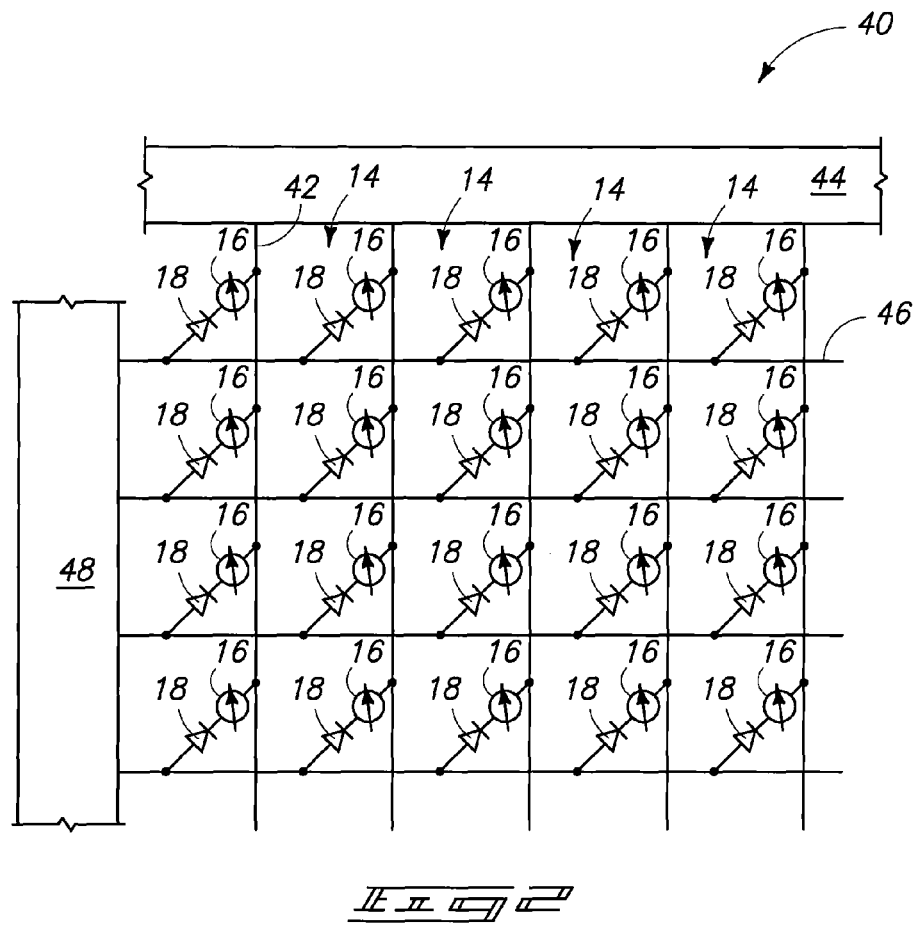
$F_{I\_G}$ $\mathbb{2}$

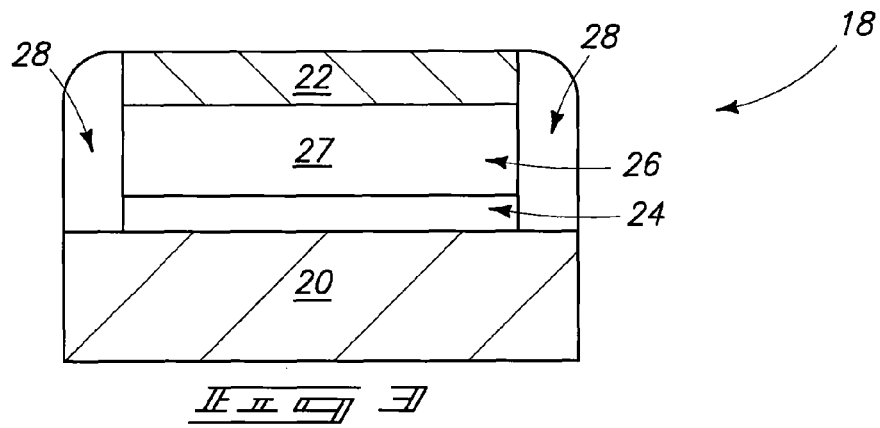
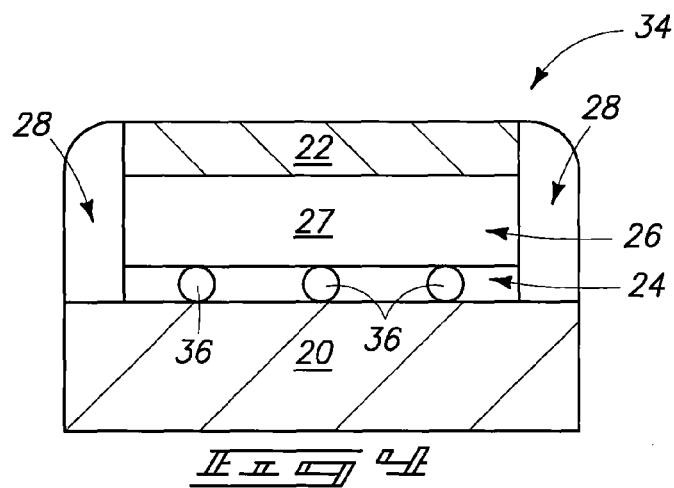
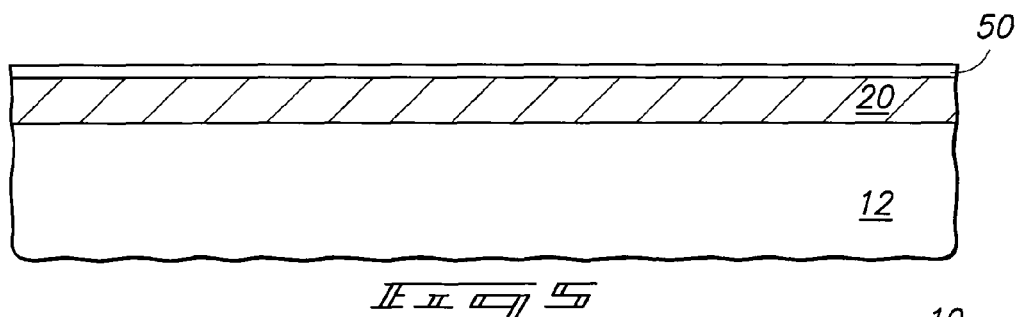
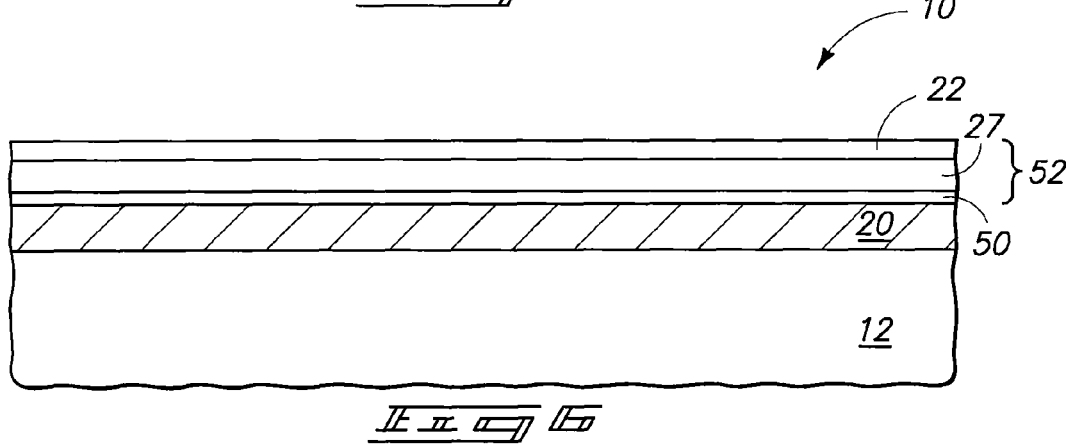

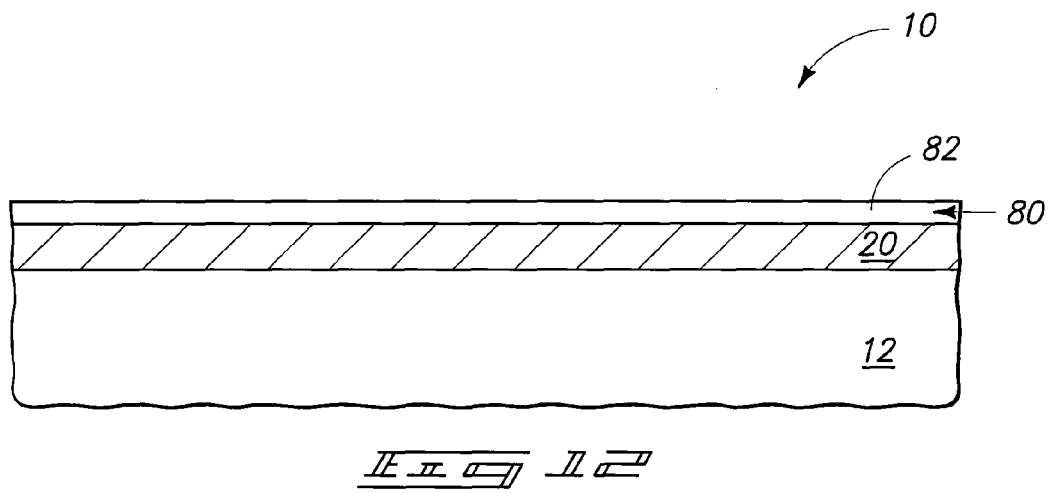
_FIG_12
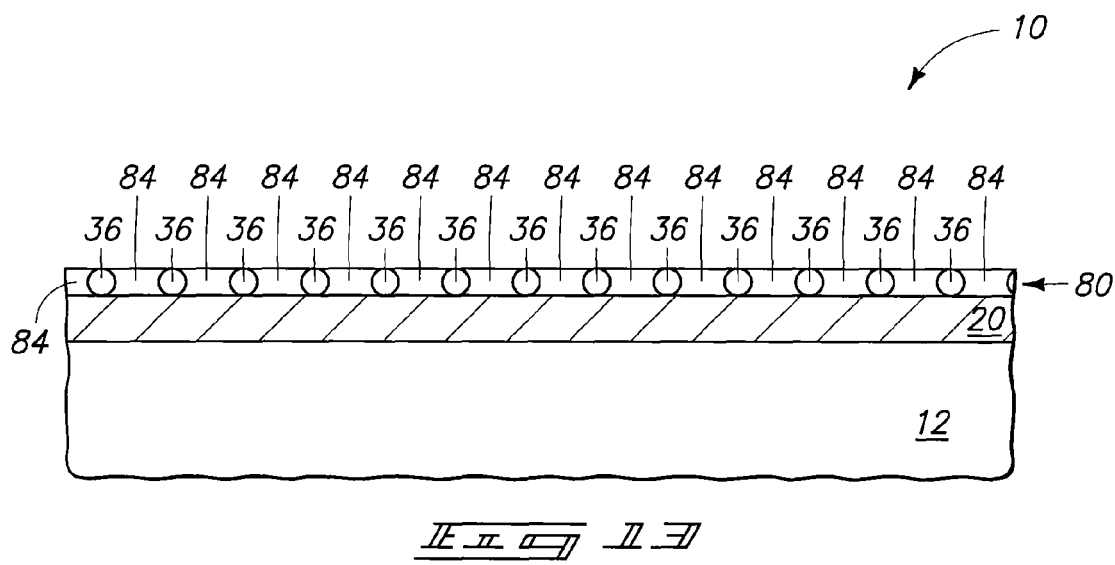
_FIG_13
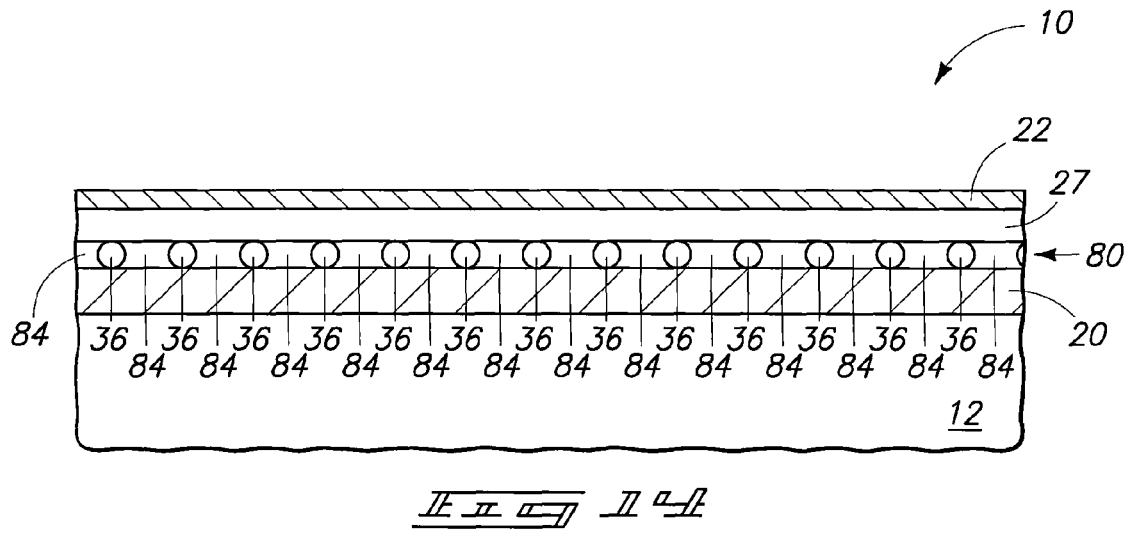
_FIG_14

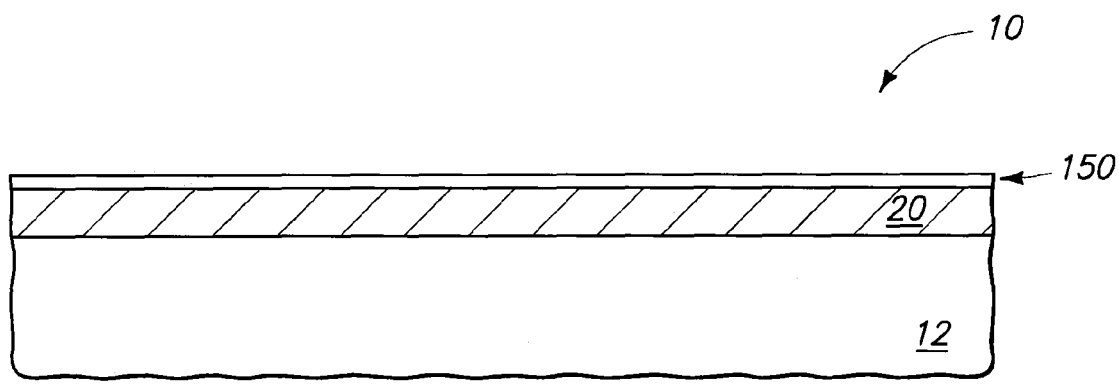
F I G 28
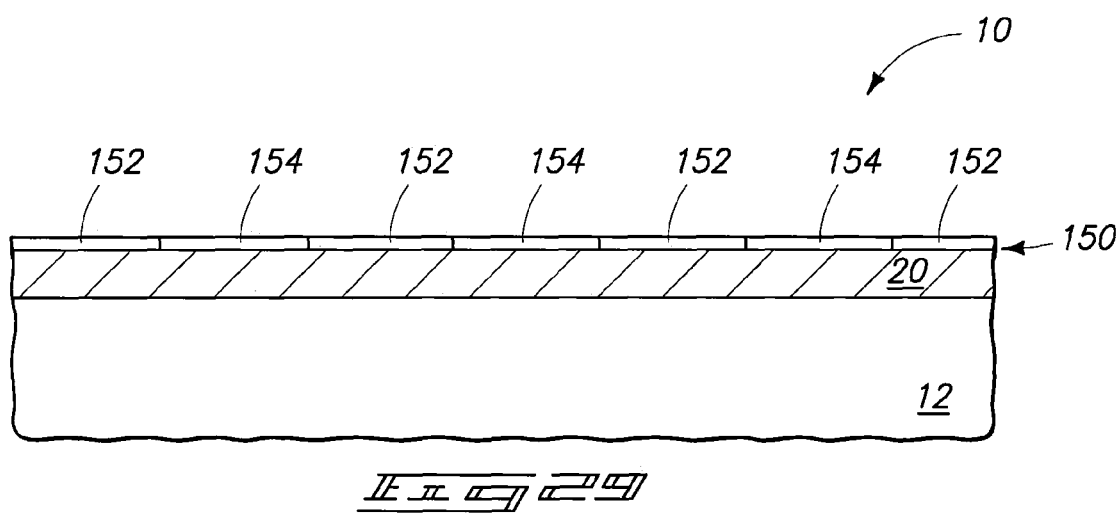
F I G 29
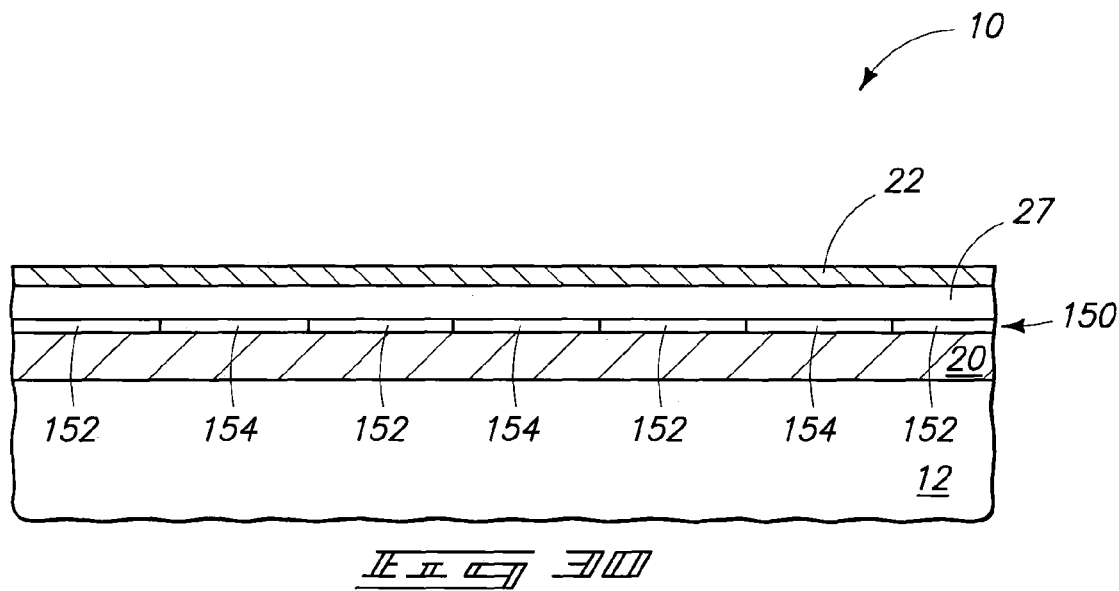
F I G 30

METHODS OF FORMING DIODES

TECHNICAL FIELD

Methods of forming diodes.

BACKGROUND

A metal-insulator-insulator-metal (MIIM) diode includes two electrical insulators between two types of metals. The insulators and metals may be tailored such that a quantum well forms between the two insulators in response to application of a forward bias, enabling high-energy quantum tunneling. When a voltage is applied to the top metal that exceeds its threshold, tunneling electrons are accelerated across the quantum well. Quantum tunneling may be faster than charging a switch junction in an integrated circuit, partially because charge may travel faster through metal than it would through other materials (such as, for example, silicon).

MIIM diodes have a sharper forward current-to-voltage (I-V) curve than metal insulator metal (MIM) diodes. The MIIM diodes may be used as tunneling devices with very high speed performance capability, and may be compatible with many substrate technologies. MIIM diodes may be used as select devices. The utilization of MIIM diodes may reduce cost and size, and improve performance of high-speed memory devices relative to utilization of other types of select devices.

However, the insulator materials used in MIIM diodes are relatively thin compared to the de Broglie electron wavelength and, thus, conventional deposition processes may cause undesirable chemical intermixing at the interfaces of the metals and insulators. Moreover, for the MIIM to function as a diode, there will be a preferred tunneling direction that results in a sharp bend in the diode forward characteristic current-voltage (I-V) curve. As a result of the high electric fields at the contact periphery or interface current caused by electron traps at the metal-insulator interface, significant edge leakage may occur in MIIM diodes. Due to high leakage currents, MIIM diodes may generally exhibit poor rectifying behavior. Increased asymmetry and nonlinearity in the I-V performance as might be achieved through avoidance of the aforementioned chemical intermixing and edge leakage exhibited by conventional MIIM diodes may result in improved performance of MIIM diodes.

In view of the above, it would be desired to develop MIIM diodes that may be scaled to smaller sizes while exhibiting an increased asymmetrical I-V curve and associated improved rectifying behavior, as well to develop methods of forming such MIIM diodes.

BRIEF DESCRIPTION OF THE DRAWINGS

FIG. 1 is a partial cross-sectional side view illustrating an embodiment of a memory device. The memory device includes example embodiment diodes as select devices.

FIG. 2 is a schematic diagram of an embodiment of a memory array in which select devices are disposed in a simple matrix form.

FIG. 3 is a diagrammatic, cross-sectional view of one of the diodes of FIG. 1.

FIG. 4 is a diagrammatic, cross-sectional view of another example diode.

FIGS. 5-9 and 11 are diagrammatic, cross-sectional views of a portion of a semiconductor construction at various sequential process stages of an example method for forming example diodes.

FIGS. 12-16 are diagrammatic, cross-sectional views of a portion of a semiconductor construction at various sequential process stages of an example method for forming example diodes.

FIGS. 28-33 are diagrammatic, cross-sectional views of a portion of a semiconductor construction at various sequential process stages of an example method for forming example diodes.

DETAILED DESCRIPTION OF THE ILLUSTRATED EMBODIMENTS

Figure 7:
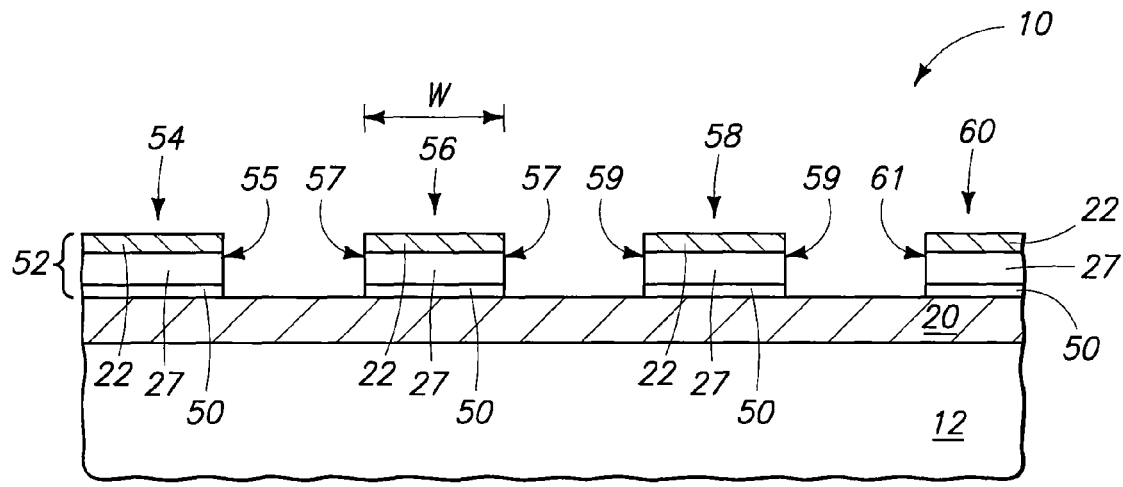

In some embodiments, the present invention comprises methods of fabricating diodes. The diodes may include two or more insulators between a pair of metals. One of the insulators may be an open volume, or in other words, a gas-filled region. The open volume may function as a high bandgap insulator having a low dielectric constant. In some embodiments, the diodes may be metal-insulator-insulator-metal (MIIM) devices.

The diodes may be utilized in memory devices and electronic systems, and may, for example, be utilized as select devices for accessing memory storage regions. The select devices, together with the memory storage regions, may be incorporated into memory devices of a memory array.

FIG. 1 shows a portion of a semiconductor construction 10 comprising a substrate 12 supporting a plurality of example memory cells 14.

Substrate 12 may be a semiconductor substrate, and in some embodiments may comprise, consist essentially of, or consist of monocrystalline silicon lightly doped with background p-type dopant.

The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The terms "semiconductive substrate," "semiconductor substrate" and "semiconductor construction" thus mean any structure that includes a semiconductor type material (with example semiconductor-type material being silicon, germanium, gallium arsenide, indium phosphide, and/or other III-V or II-VI type semiconductor materials). Semiconductor constructions may include, for example, silicon wafers, silicon-on-insulator (SOI) type constructions, silicon-on-sapphire (SOS) type constructions, and epitaxial layers of silicon supported by a layer of base material. Semiconductor materials may be doped or undoped. In some embodiments, a semiconductor construction may include various layers and materials associated with the fabrication of integrated circuitry. The term "substrate" refers to any supporting structure, including, but not limited to, the semiconductor substrates described above.

Each of the memory cells 14 comprises a charge storage region 16, and a select device 18 configured to enable access to the charge storage region during reading and writing operations (the select device 18 may be alternatively referred to as an access device). In the shown embodiment, the select devices 18 connect to the charge storage regions 16 through conductive interconnects 17. In other embodiments, the conductive interconnects may be omitted, and the select devices may physically contact the charge storage regions.

The charge storage regions 16 may, for example, comprise, consist essentially of, or consist of phase change material.

The select devices 18 are diodes comprising a first electrically conductive material 20, a second electrically conductive material 22, and a pair of dielectric regions 24 and 26 between the first and second electrically conductive materials.

The four memory cells 14 may be part of a memory array. Such array may have a plurality of rows and columns, and the cross-section of FIG. 1 may be considered to extend along one of the rows of the array. The first electrically conductive material 20 is a line connecting all of the select devices 18 along the row illustrated in FIG. 1. The second electrically conductive material 22 may extend along columns of the array in some embodiments.

The first electrically conductive material 20 may have a low work function relative to the second electrically conductive material 22. In some embodiments, the first electrically conductive material 20 may comprise one or more compositions selected from the group consisting of tantalum silicon nitride, chromium and tantalum metal; and the second electrically conductive material 22 may comprise one or more compositions selected from the group consisting of platinum, titanium nitride and tantalum nitride.

The dielectric region 24 may be an open volume (or in other words a gas-filled space) in some embodiments.

The dielectric region 26 contains a material 27. Such material may comprise any suitable composition or combination of compositions; and in some embodiments may comprise, consist essentially of, or consist of one or more of zirconium oxide, hafnium oxide and titanium oxide.

In the shown embodiment, electrically insulative sidewall spacers 28 are along sidewalls of the select devices 18. Such sidewall spacers may comprise any suitable composition, or combination of compositions; and in some embodiments may comprise, consist essentially of, or consist of one or more of silicon nitride, silicon dioxide, and silicon oxynitride.

An electrically insulative material 30 is shown to extend between the various memory cells 14. Material 30 may comprise any suitable composition or combination of compositions; and in some embodiments may comprise, consist essentially of, or consist of one or more of silicon dioxide, silicon nitride, and any of various doped silicon oxides (for instance, borophosphosilicate glass, phosphosilicate glass, fluorosilicate glass, etc.).

The charge storage regions 16 of the individual memory cells 14 are connected to a line of electrically conductive material 32.

In operation, the select devices 18 are utilized for uniquely accessing individual charge storage regions 16 within an array of memory cells 14. If charge storage regions 16 correspond to phase change material, the array may be an array of phase change random access memory (PCRAM).

FIG. 2 diagrammatically illustrates an example memory array 40 which may comprise memory cells 14. The memory cells include the diodes 18 utilized as select devices, and the charge storage regions 16 (diagrammatically illustrated as circles with arrows extending therethrough). The memory cells are arranged in a simple matrix form; for selectively writing information to the memory cells, and selectively reading information from the memory cells. Example circuitry is shown in FIG. 2, with such example circuitry including first electrodes 42 (only one of which is labeled), a first drive circuit 44 for selectively controlling the first electrodes, second electrodes 46 (only one of which is labeled), and a second drive circuit 48 for selectively controlling the second electrodes. A signal detection circuit (not shown) may also be provided.

The first electrodes may be utilized as wordlines for line selection, and the second electrodes may be utilized as bitlines for row selection. The second electrodes may be arranged orthogonally relative to the first electrodes. In some embodiments, one of the first or second electrodes may comprise the first conductive material 20 of FIG. 1, and the other of the first and second electrodes may comprise the conductive material 22 of FIG. 1.

The select devices 18 are diodes, and FIG. 3 illustrates one of such diodes in a view that is enlarged relative to the view of FIG. 1. The diode 18 includes the first conductive material 20, second conductive material 22, dielectric region 24, dielectric region 26, and sidewall spacers 28. As discussed above, the dielectric region 24 may be an open volume, and the dielectric region 26 contains a material 27 that may correspond to one or more compositions of solid material. The spacers 28 are utilized to provide support along the sides of materials 27 and 22 so that the materials do not fall into the open volume of dielectric region 24. The shown diode is a MIIM, and thus contains only a single dielectric material 27 over the open volume corresponding to dielectric region 24. In other embodiments (not shown) there may be more than two dielectric materials over the dielectric region 24.

In some embodiments, additional support may be provided between materials 20 and 27 besides, or alternatively to, the spacers 28. For instance, FIG. 4 shows a diode 34 of another example embodiment. Similar numbering will be used to describe diode 34 of FIG. 4 as is used above to describe diode 18 of FIG. 3, where appropriate.

Diode 34 comprises the first electrically conductive material 20, second electrically conductive material 22, and sidewall spacers 28 discussed above. Diode 34 also comprises the first dielectric region 24 and the second dielectric region 26. The dielectric region 26 contains material 27, and the dielectric region 24 contains an open volume. However, in contrast to the embodiment of FIG. 3, a plurality of supports 36 extend through the open volume of the second dielectric region 24 to assist in supporting material 27. The supports 36 may be electrically insulative in some embodiments. For instance, the supports 36 may comprise, consist essentially of, or consist of silicon dioxide, metal oxide (for instance, platinum oxide, ruthenium oxide, titanium oxide, etc.), silicon nitride, etc. In other embodiments, the supports 36 may be electrically conductive, but may be so small and/or so weakly conductive that they do not enable channeling of current through dielectric region 24. For instance, supports 36 may comprise, consist essentially of, or consist of one or more of various metal silicides (for example, ruthenium silicide, titanium silicide, platinum silicide, etc.).

The shown diode 34 is a MIIM, and thus contains only a single dielectric material 27 over the open volume of dielectric region 24. In other embodiments (not shown) there may be more than two dielectric materials over the dielectric region 24.

FIGS. 5-11 illustrate an example method for forming diodes of the type shown in FIG. 3. FIGS. 5-11 will be labeled utilizing numbering identical to that utilized in describing FIG. 3, where appropriate.

Referring to FIG. 5, first conductive material 20 is formed over substrate 12, and a sacrificial material 50 is formed over the first conductive material.

The sacrificial material 50 may comprise any composition or combination of compositions which may be selectively removed relative to the underlying material 20, and relative to an overlying dielectric material 27 that will be formed in processing discussed below. In some embodiments, sacrificial material 50 may comprise, consist essentially of, or consist of silicon dioxide, carbon (for instance, graphene), or carbon-containing compositions (for instance, organic polymers).

Sacrificial material 50 may be formed with any suitable processing, such as, for example, chemical vapor deposition (CVD), atomic layer deposition (ALD), spin-on deposition, vapor deposition, etc. In some embodiments, material 50 may be formed with ALD so that the material may be provided to be thin, conformal and uniform in composition. In some embodiments, material 50 may be formed to a thickness of less than or equal to 50 angstroms, or even less than or equal to 10 angstroms. Sacrificial material 50 is ultimately removed to leave the void corresponding to dielectric region 24 of FIG. 3, and it can be advantageous for such void to be less than or equal to about 10 angstroms thick in order to achieve desired electrical properties of the diode containing such void.

Referring to FIG. 6, dielectric material 27 is formed over sacrificial material 50, and the second conductive material 22 is formed over the dielectric material. In some embodiments (not shown), more than one dielectric material may be formed over sacrificial material 50. Generally, at least one dielectric material will be formed over sacrificial material 50, and the second conductive material 22 will be formed over said at least one dielectric material.

The materials 50, 27 and 22 may be together considered to correspond to a stack 52, and such stack may be patterned into a plurality of spaced apart features 54, 56, 58 and 60, as shown in FIG. 7. The patterning of the stack into the spaced apart features may be accomplished with any suitable processing. In some embodiments, a photolithographically-patterned mask (not shown) may be formed over the stack, a pattern transferred from the mask into the stack with one or more suitable etches, and then the mask removed to leave the construction shown in FIG. 7.

The spaced apart features 54, 56, 58 and 60 each comprises a pair of opposing sidewalls (although only one of the sidewalls of each of features 54 and 60 is illustrated in the view of FIG. 7); with the sidewalls of features 54, 56, 58 and 60 being labeled 55, 57, 59 and 61, respectively. The sidewalls 55, 57, 59 and 61 each include segments of sacrificial material 50, dielectric material 27, and conductive material 22. The features may have any suitable width (W), and in some embodiments may have widths of from about 40 nanometers to about 50 nanometers, or from about 10 nanometers to about 20 nanometers.

Figure 8:
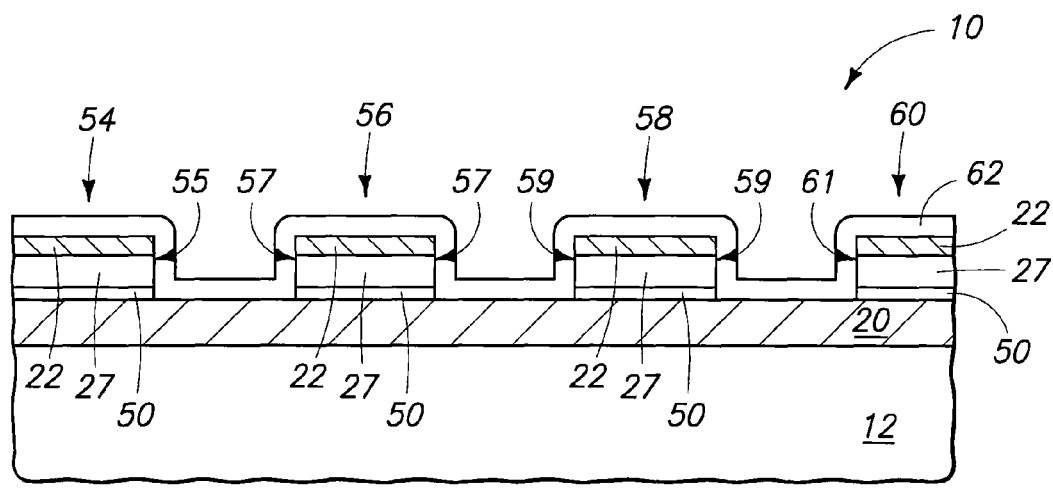

Referring to FIG. 8, a spacer material 62 is formed over and between features 54, 56, 58 and 60. The spacer material extends conformally along the sidewalls 55, 57, 59 and 61. The spacer material may comprise any suitable composition or combination of compositions; and may, for example, comprise, consist essentially of, or consist of one or more of silicon dioxide, silicon nitride and silicon oxynitride. The spacer material may be formed by any suitable method, such as, for example, ALD or CVD.

Figure 9:
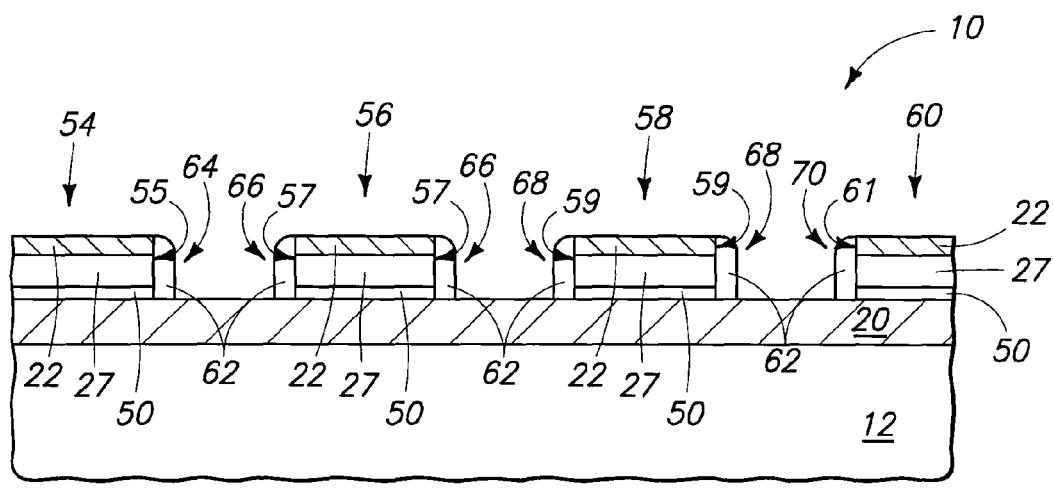

Referring to FIG. 9, spacer material 62 is anisotropically etched to form a plurality of spacers 64, 66, 68 and 70 along the sidewalls 55, 57, 59 and 61, respectively.

Figure 10:
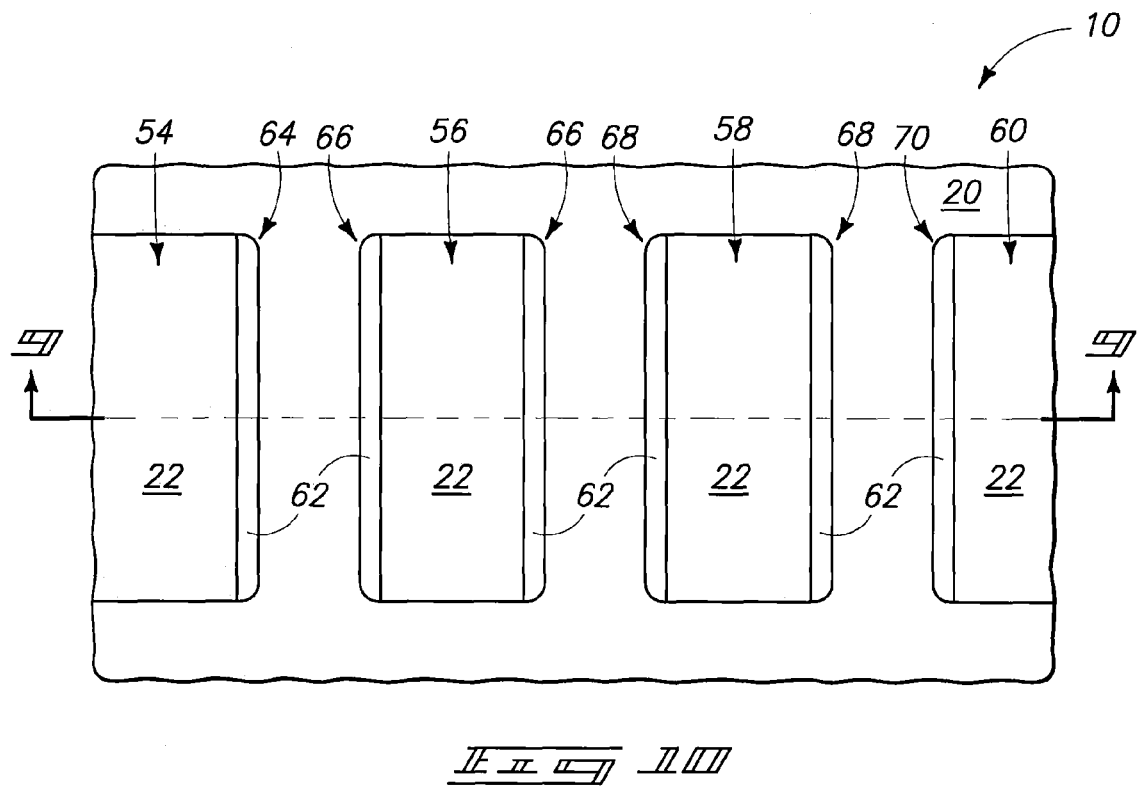
FIG. 10 is a top view of the semiconductor construction of FIG. 9.

The features 54, 56, 58 and 60 may correspond to lines extending into and out of the page relative to the cross-section of FIG. 9. FIG. 10 shows a top view of construction 10 at the processing stage of FIG. 9, and shows the features 54, 56, 58 and 60 as lines extending across conductive material 20.

The top view of FIG. 10 shows spacer material 62 patterned to extend along sides of the lines corresponding to features 54, 56, 58 and 60, but not being along ends of the lines. Such patterning of the spacer material 62 may be accomplished before or after the anisotropic etch of the spacer material. The patterning of the spacer material may comprise forming a protective mask (not shown) over the spacer material along the sides of the lines while leaving the spacer material along the ends of the lines exposed to an etch, using the etch to remove the spacer material from along the ends the lines, and then removing the protective mask.

Figure 11:
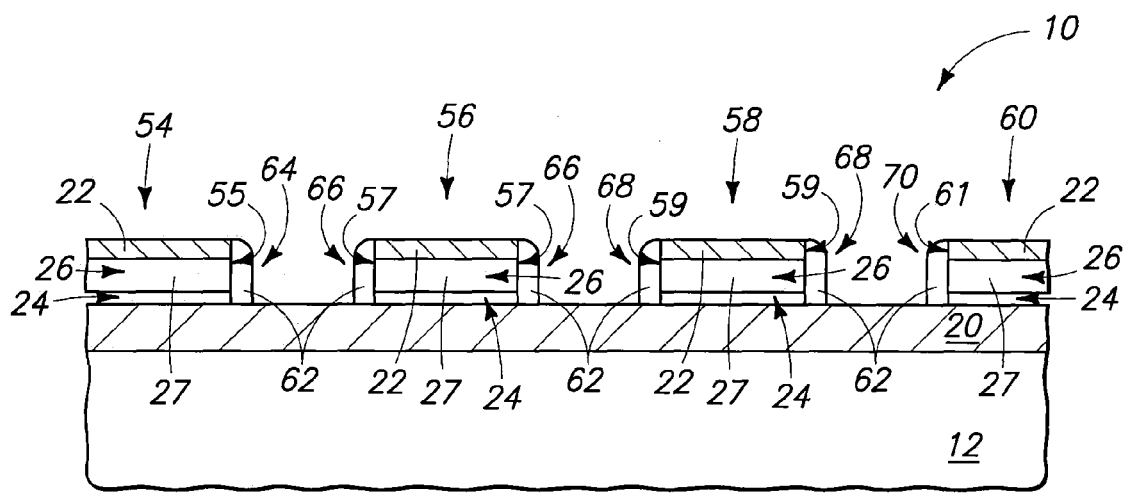

The lack of spacer material along the ends of the lines enables sacrificial material 50 to be exposed to an etchant. FIG. 11 shows construction 10 after utilization of an etchant to remove material 50 (FIG. 9) from under dielectric material 27, and thereby form a void under the dielectric material. Such void may be referred to as a gas-filled gap, and corresponds to the dielectric region 24 discussed above with reference to FIG. 3.

The sacrificial material 50 (FIG. 9) may be removed with any etch selective for material 50 relative to other exposed materials of construction 10. The term "selective" means that the etch removes material 50 faster than other exposed materials, and includes, but is not limited to, etches which are 100 percent selective for material 50 relative to other exposed materials. If the sacrificial material 50 comprises carbon, an example etch may utilize an $O_2$ plasma. If sacrificial material 50 comprises silicon dioxide, an example etch may utilize hydrofluoric acid.

The features 54, 56, 58 and 60 at the processing stage of FIG. 11, together with conductive material 20, form diodes analogous to the diode 18 discussed above with reference to FIG. 3. In subsequent processing (not shown) various structures and materials of FIG. 1 may be formed over the features 54, 56, 58 and 60 to incorporate such features into a memory array.

FIGS. 12-17 illustrate an example method for forming diodes of the type shown in FIG. 4. FIGS. 12-17 will be labeled utilizing numbering identical to that utilized in describing FIG. 4, where appropriate.

Referring to FIG. 12, first conductive material 20 is formed over substrate 12, and a layer 80 is formed over the first conductive material.

The layer 80 is shown to consist of a material 82. Material 82 may be a block copolymer in some embodiments. Block copolymers contain two or more homopolymer subunits linked by covalent bonds. The union of the homopolymer subunits may utilize an intermediate linkage, known as a junction block. Block copolymers with two distinct blocks are referred to as diblock copolymers. Example diblock copolymers include polystyrene-b-poly(2-vinylpyridine) (PS-b-P2VP); polystyrene-b-poly (ethylene-alt-propylene); polystyrene-b-poly(methylmethacrylate) (PS-b-MMA); and polystyrene-b-poly(dimethyl-siloxane) (PS-b-PDMS). The "b" utilized in each of the above chemical formulas indicates a block linkage.

Diblock copolymers may be generically represented as A-B, where the "A" represents one of the homopolymer subunits, the "B" represents the other of the homopolymer subunits, and the hyphen represents a covalent bond.

In some diblock copolymers, the homopolymer subunits A and B preferentially interact with like subunits, and avoid interactions with one another. Such diblock copolymers will tend to self-assemble in chains having a repeating pattern that may be represented as A-B:B-A:A-B:B-A:A-B. In such pattern, the hyphens represent covalent bonds and the colons represent non-covalent interactions. Such self-assembly may be taken advantage of to form patterns over substrates.

Referring to FIG. 13, construction 10 is shown at a processing stage after self-assembly has been initiated within a material 82 (FIG. 12) consisting of block copolymer. Such self-assembly has converted material 82 into a repeating pattern of alternating subunits 84 and 36. Ultimately, the subunits 36 may correspond to supports, and the subunits 84 may be utilized as a sacrificial material. In some embodiments, the self-assembly of the block copolymer may be considered to correspond to chemical modification of layer 80; with such modification resulting in formation of supports 36 interspersed in sacrificial material 84. Although an entirety of layer 80 is shown to be modified, in other embodiments only a portion of the layer may be modified.

Referring to FIG. 14, dielectric material 27 is formed over layer 80, and the second conductive material 22 is formed over the dielectric material. In some embodiments (not shown), more than one dielectric material may be formed over layer 80. Generally, at least one dielectric material will be formed over layer 80, and the second conductive material 22 will be formed over said at least one dielectric material.

Figure 15:
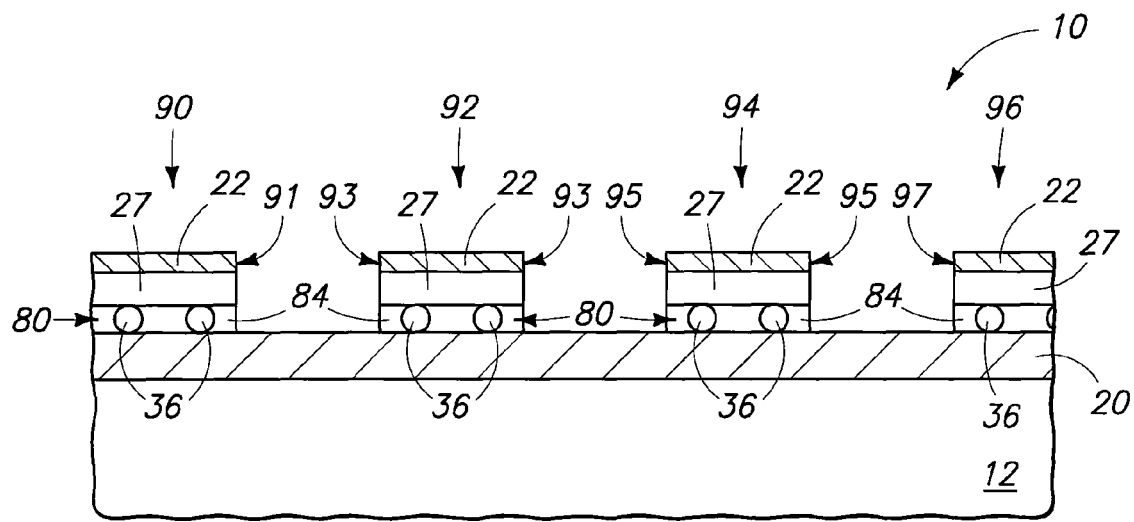

Referring to FIG. 15, layer 80, and materials 27 and 22, are together patterned into a plurality of spaced apart features 90, 92, 94 and 96. The spaced apart features may be formed with any suitable processing. In some embodiments, a photolithographically-patterned mask (not shown) may be formed over material 22, a pattern transferred from the mask into layer 80 and materials 22 and 27 with one or more suitable etches, and then the mask removed to leave the construction shown in FIG. 15.

The spaced apart features 90, 92, 94 and 96 each comprises a pair of opposing sidewalls (although only one of the sidewalls of each of features 90 and 96 is illustrated in the view of FIG. 15); with the sidewalls of features 90, 92, 94 and 96 being labeled 91, 93, 95 and 97, respectively. The sidewalls 91, 93, 95 and 97 each include segments of layer 80, dielectric material 27, and conductive material 22.

Figure 16:
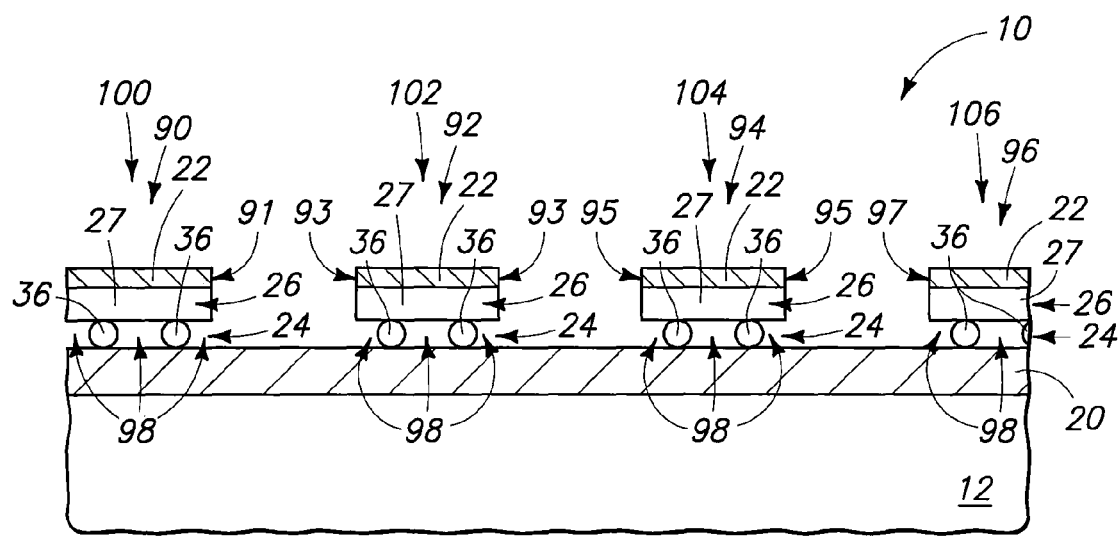

Referring to FIG. 16, an entirety of sacrificial material 84 (FIG. 15) is removed, while leaving supports 36 to support the materials 27 and 22 that overlie such supports. The sacrificial material may be removed with any etch that is selective relative to other exposed materials of construction 10. In some embodiments, sacrificial material 84 may be an organic material, and may be removed with an etch utilizing $O_2$ and plasma.

The removal of sacrificial material 84 creates voids (or gaps) 98 under dielectric material 27. The conductive materials 20 and 22, together with gaps 98 and dielectric material 27, correspond to a plurality of diodes 100, 102, 104 and 106 supported by substrate 12. The gaps 98 may be considered to be comprised by the first dielectric region 24 that was discussed above with reference to FIG. 4, and dielectric material 27 may be considered to be comprised by the second dielectric region 26 that was discussed above with reference to FIG. 4. The diodes 100, 102, 104 and 106 may be incorporated into a memory array, analogous to the memory array discussed above with reference to FIG. 1.

An advantage of the processing of FIGS. 15 and 16, relative to that of the above-discussed FIGS. 9-11, is that the etchant utilized to remove the sacrificial material may penetrate under material 27 from numerous directions in the processing of FIGS. 15 and 16. In contrast, the etchant penetrated under material 27 only from the ends of the lines in the processing of FIGS. 9-11.

Each of the features 90, 92, 94 and 96 is shown supported by two supports 36 in the illustrated example embodiment. In other embodiments, there may be alternative numbers of supports associated with the various features. Also, the shown supports 36 are large relative to voids 98, and thus the dielectric properties of the supports 36 may have a significant influence on the electrical properties of diodes 100, 102, 104 and 106. In some embodiments, the supports may be very small (with sizes on the order of nanodots), and utilized sparingly so that the supports do not have a significant influence on the electrical properties of the diodes.

Figure 17:
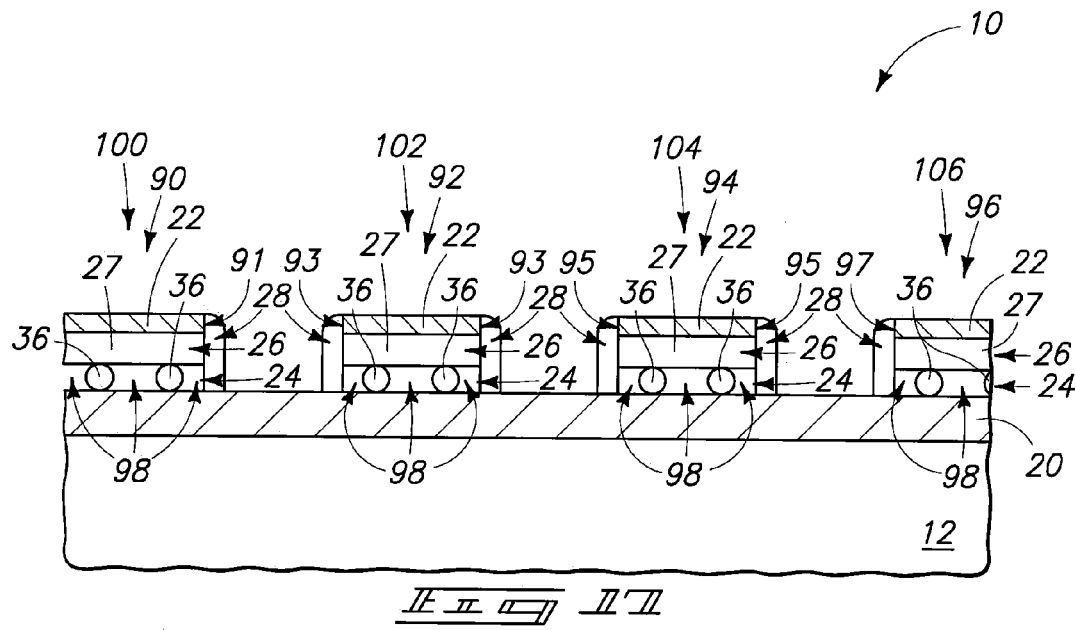
FIG. 17 is a diagrammatic, cross-sectional view of the semiconductor construction portion of FIGS. 12-16 shown at an optional processing stage subsequent to the processing stage of FIG. 16.

The construction of FIG. 16 may be incorporated into a memory array without provision of spacers along sidewalls 91, 93, 95 and 97, since materials 27 and 22 are supported over material 20 by supports 36. Alternatively, spacers may be formed along the sidewalls 91, 93, 95 and 97 provide additional support, and/or to provide electrical isolation along the sides of conductive material 22. FIG. 17 shows construction 10 after spacers 28 have been formed along sidewalls 91, 93, 95 and 97.

The spacers may be formed with any suitable processing, such as, for example, processing analogous to that discussed above with reference to FIGS. 8 and 9 for formation of spacers 64, 66, 68 and 70. The embodiment of FIGS. 8 and 9 formed a layer of spacer material conformally across elevated structures (the spaced apart features 54, 56, 58 and 60 of FIG. 8), and across regions of conductive material 20 between the structures. Analogously, a layer of spacer material may be formed across the elevated structures corresponding to diodes 100, 102, 104 and 106 of FIG. 16, and across the intervening regions of conductive material 20 between such elevated structures; and then such material may be anisotropically etched to form the spacers 28 of FIG. 17. However, in some embodiments it may be desired to form the spacers without deposition of spacer material along the bulk of the surface of conductive material 20 exposed between structures 100, 102, 104 and 106. In such embodiments, the deposition process may be modified so that it is less conformal, and specifically so that it is more selective for depositing spacer material along the sidewalls of structures 100, 102, 104 and 106 than along exposed regions of conductive material 20.

The example embodiments of FIGS. 12-17 comprise inducement of self-assembly within a block copolymer (in other words, chemical modification of the layer 80 of FIG. 12 to convert such layer to the form shown in FIG. 13) at an early process stage. Specifically, in the illustrated embodiment such inducement of self-assembly occurs prior to formation of the materials 27 and 22 over the block copolymer. In other embodiments, the self-assembly may be induced after formation of one or both of the materials 27 and 22. Also, although the example embodiment of FIGS. 12-17 comprises inducement of self-assembly within the block copolymer prior to the patterning of materials 27 and 22 into the features 90, 92, 94 and 96 (FIG. 15), in other embodiments the inducement of self-assembly may be conducted after such patterning. If the inducement of self-assembly occurs after the patterning of materials 27 and 22 into the features 90, 92, 94 and 96, such inducement may be conducted before or after the formation of spacers 28 (FIG. 17). In some embodiments, the self-assembly may be induced after formation of the spacers 28, and the spacers may be used to assist in induce a desired configuration of subunits during the self-assembly. In some embodiments, the inducement of self-assembly of the block copolymer may utilize a temperature that could impart thermal damage to one or both of materials, 27 and 22, and the self-assembly could thus be induced prior to deposition of one or both of materials 27 and 22. In other embodiments, the inducement of self-assembly of the block copolymer may utilize a temperature compatible with materials 27 and 22 (i.e., a temperature which does not impart thermal damage to materials 27 and 22), and the self-assembly could thus be induced after deposition of materials 27 and 22.

Figure 18:
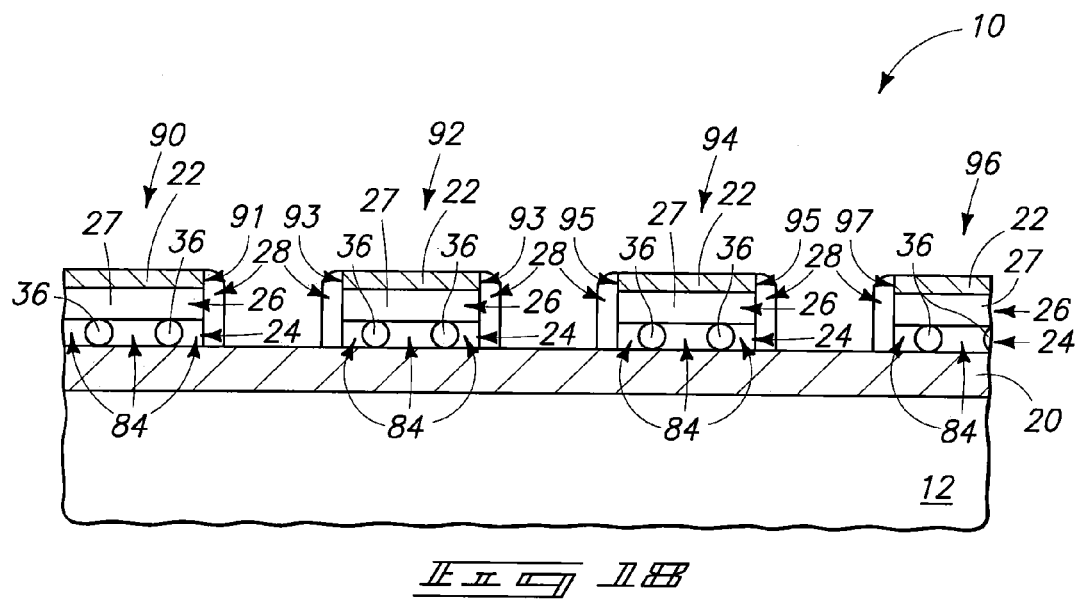
FIGS. 18 and 19 are diagrammatic, cross-sectionals view of the semiconductor construction portion of FIGS. 12-16 shown at alternative processing stages subsequent to the processing stage of FIG. 15.
Figure 19:
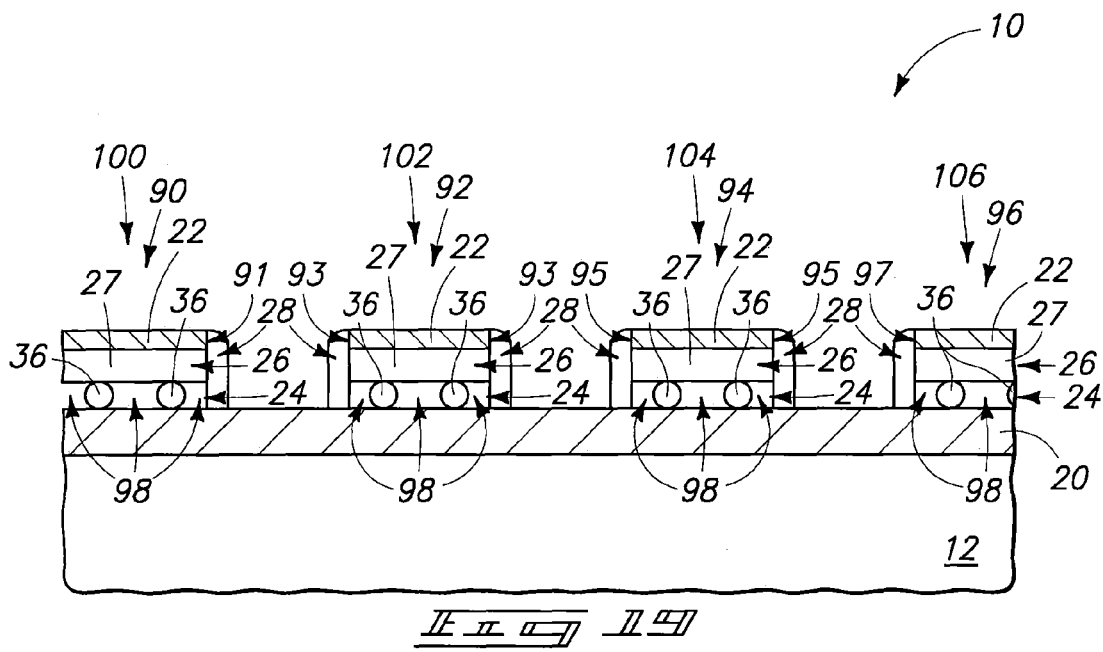

In some embodiments, supports 36 (FIG. 16) may be sufficient in strength and numbers to fully support the overlying materials 27 and 22. In other embodiments, supports 36 may be provided to enhance the support of the overlying materials 27 and 22, but may not be sufficient by themselves to support such overlying materials. In such other embodiments, it may be desired to form spacers 28 prior to removal of the sacrificial material adjacent supports 36. FIG. 18 shows construction 10 at a processing stage subsequent to FIG. 15 in accordance with an embodiment in which spacers 28 are formed prior to removal of sacrificial material 84. The sacrificial material may then be removed to form the construction of FIG. 19, which is identical to the construction discussed above with reference to FIG. 17. The features 90, 92, 94 and 96 may comprise open ends analogous to the open ends of features 54, 56, 58 and 60 shown in FIG. 10, and the removal of the sacrificial material may be accomplished by introducing etchant from such open ends utilizing processing analogous to that discussed above with reference to FIGS. 9-11. After the sacrificial material 84 (FIG. 15) is removed, voids 98 are created. The materials 27 and 22 are supported over the voids by supports 36 in combination with spacers 28.

FIGS. 20-25 illustrate another example method for forming diodes of the type shown in FIG. 4. FIGS. 20-25 will be labeled utilizing numbering identical to that utilized in describing FIG. 4, where appropriate.

Figure 20:
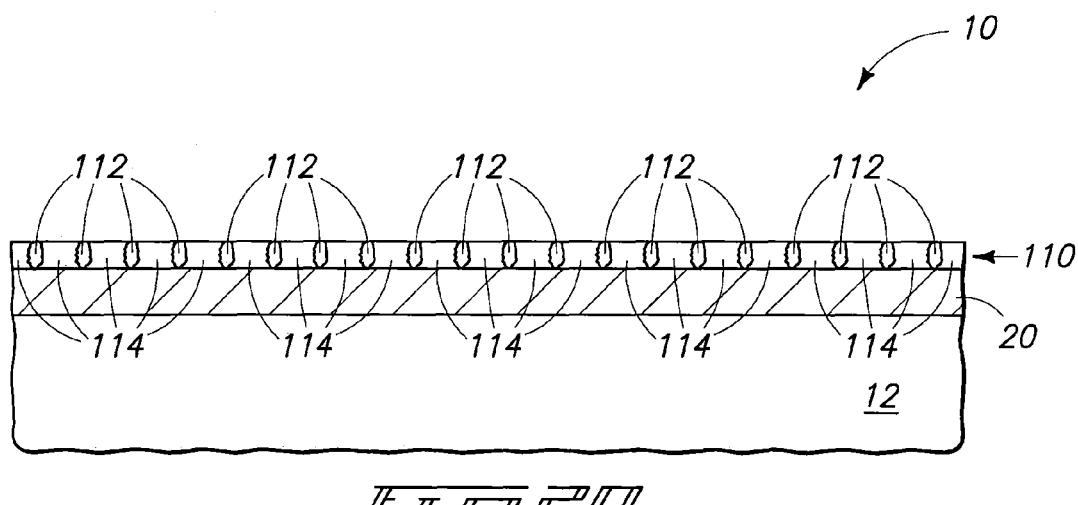
FIGS. 20-25 are diagrammatic, cross-sectional views of a portion of a semiconductor construction at various sequential process stages of an example method for forming example diodes.

Referring to FIG. 20, semiconductor construction 10 is shown at a processing stage subsequent to formation of first conductive material 20 over substrate 12, and subsequent to formation of a layer 110 over conductive material 20. The layer 110 comprises a plurality of particles 112 dispersed within a sacrificial material 114. In some embodiments, particles 112 may comprise metal, and material 114 may comprise a composition reactive with such metal.

Figure 21:
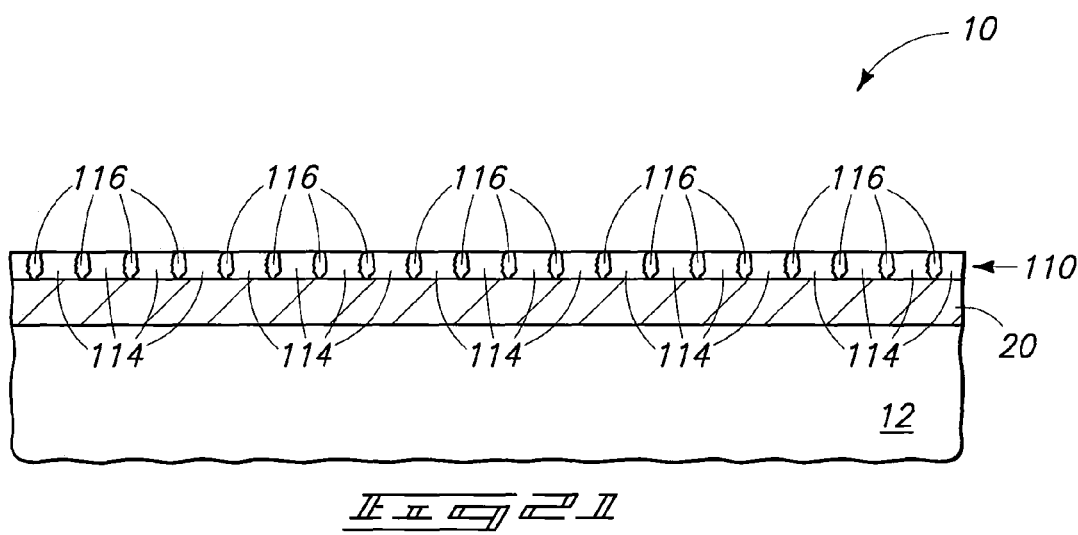

Referring to FIG. 21, construction 10 is shown at a processing stage subsequent to reaction of particles 112 (FIG. 20) with sacrificial material 110. Such reaction has modified the particles, and the modified particles are labeled as 116 in FIG. 21. The modification may chemically alter surfaces of the particles, or may create chemical changes that penetrate entirely through the particles; depending on, among other things, the size of particles and the nature of the modification.

In some embodiments, the particles 112 of FIG. 20 may comprise, consist essentially of, or consist of one or more metals (for instance, platinum, ruthenium, titanium, etc.), the sacrificial material may comprise, consist of, or consist of an oxygen-containing composition (for instance, silicon dioxide, etc.), and the modified particles 116 of FIG. 21 may comprise, consist essentially of, or consist of one or more metal oxides (for instance, platinum oxide, ruthenium oxide, titanium oxide, etc.). In other embodiments, the particles 112 of FIG. 20 may comprise, consist essentially of, or consist of one or more metals (for instance, platinum, ruthenium, titanium, etc.), the sacrificial material may comprise, consist of, or consist of silicon, and the modified particles 116 of FIG. 21 may comprise, consist essentially of, or consist of one or more metal silicides (for instance, platinum silicide, ruthenium silicide, titanium silicide, etc.).

In some embodiments, the particles 112 of FIG. 20 may consist of electrically conductive material, and the modified particles 116 of FIG. 21 may consist of electrically insulative material. Ultimately, the modified particles may be incorporated into a dielectric region of a diode as supports (analogous to the supports 36 of FIG. 4) extending across a gap. It may be advantageous to utilize electrically insulative particles as the supports within the dielectric region of the diode. In other embodiments, the modified particles 116 may be electrically conductive (for instance, the modified particles may correspond to an electrically conductive metal silicide). However, if the modified particles are kept very thin (for instance, if the modified particles correspond to nanodots or nanowires), and if they are formed of materials having fairly low conductivity (for instance, platinum silicide) they may still be incorporated as supports extending through a dielectric region of the resulting diode without forming a problematic conductive path across the dielectric region.

Figure 22:
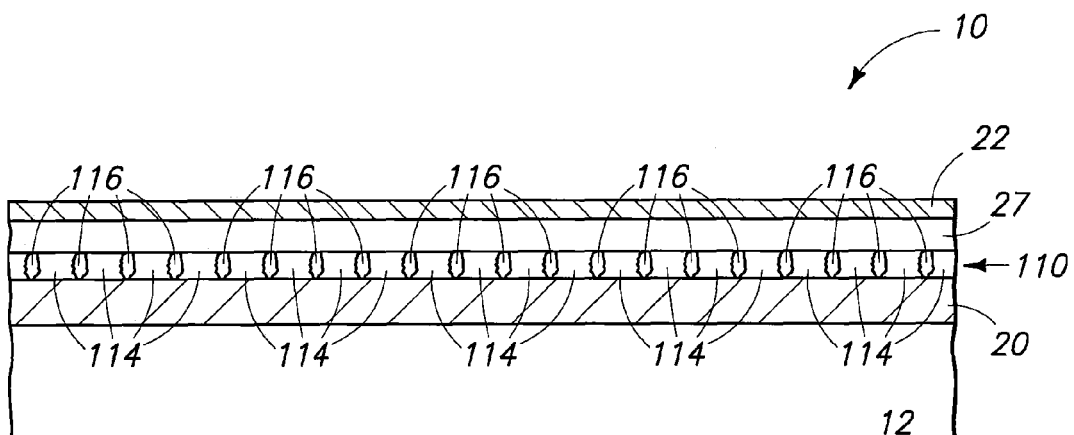

Referring to FIG. 22, dielectric material 27 is formed over layer 110, and the second conductive material 22 is formed over the dielectric material. In some embodiments (not shown), more than one dielectric material may be formed over layer 110. Generally, at least one dielectric material will be formed over layer 110, and the second conductive material 22 will be formed over said at least one dielectric material.

Figure 23:
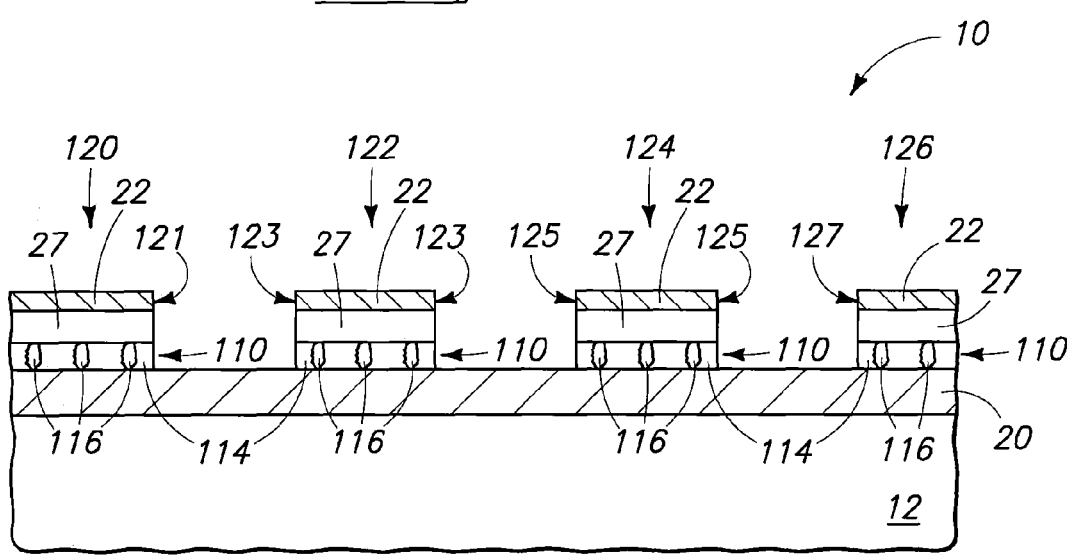

Referring to FIG. 23, layer 110, and materials 27 and 22, are together patterned into a plurality of spaced apart features 120, 122, 124 and 126. The spaced apart features may be formed with any suitable processing. In some embodiments, a photolithographically-patterned mask (not shown) may be formed over the material 22, a pattern transferred from the mask into layer 110 and materials 22 and 27 with one or more suitable etches, and then the mask removed to leave the construction shown in FIG. 23.

The spaced apart features 120, 122, 124 and 126 each comprises a pair of opposing sidewalls (although only one of the sidewalls of each of features 120 and 126 is illustrated in the view of FIG. 23); with the sidewalls of features 120, 122, 124 and 126 being labeled 121, 123, 125 and 127, respectively. The sidewalls 121, 123, 125 and 127 each include segments of layer 110, dielectric material 27, and conductive material 22.

Figure 24:
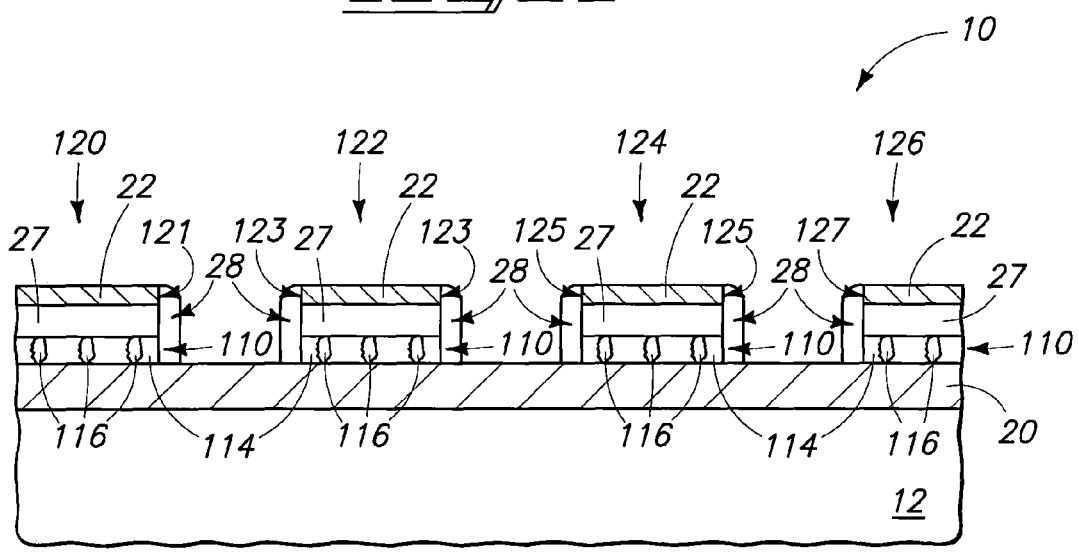

Referring to FIG. 24, spacers 28 are formed along sidewalls 121, 123, 125 and 127. The spacers may be formed with any suitable processing, such as, for example, processing analogous to that discussed above with reference to FIGS. 8 and 9 for formation of spacers 64, 66, 68 and 70.

Figure 25:
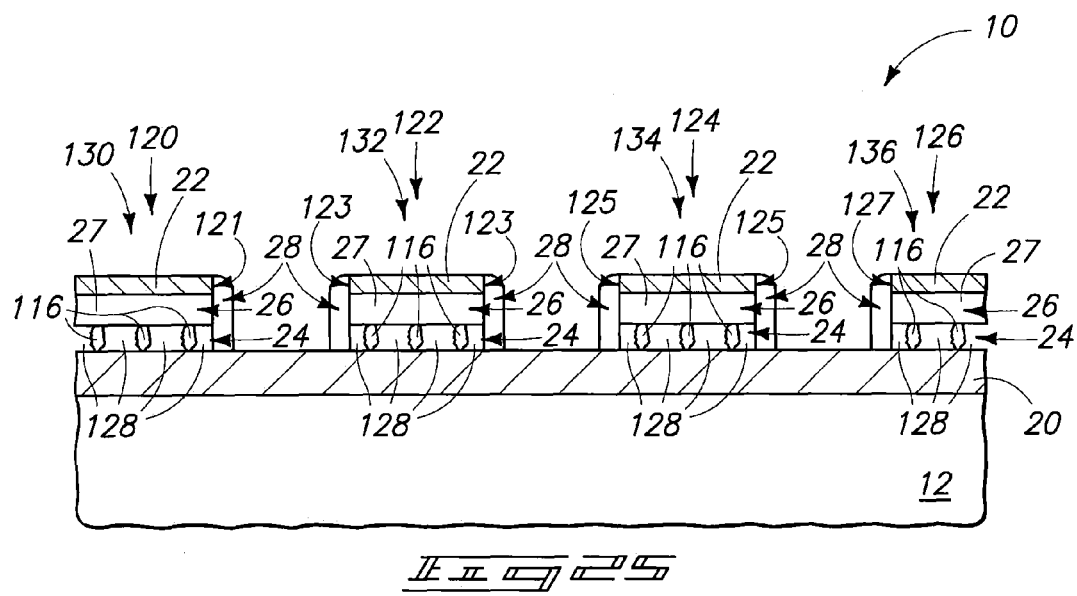

Referring to FIG. 25, an entirety of sacrificial material 114 (FIG. 24) is removed, while leaving particles 116 as supports (analogous to the supports 36 of FIG. 4) to assist in supporting the materials 27 and 22. The removal of sacrificial material 114 creates voids (or gaps) 128 under dielectric material 27. The features 120, 122, 124 and 126 may comprise open ends analogous to the open ends of features 54, 56, 58 and 60 shown in FIG. 10, and the removal of the sacrificial material may be accomplished by introducing etchant from such open ends utilizing processing analogous to that discussed above with reference to FIGS. 9-11.

The conductive materials 20 and 22, together with gaps 128 and dielectric material 27, correspond to a plurality of diodes 130, 132, 134 and 136 supported by substrate 12. The gaps 128 may be considered to be comprised by the first dielectric region 24 that was discussed above with reference to FIG. 4, and dielectric material 27 may be considered to be comprised by the second dielectric region 26 that was discussed above with reference to FIG. 4. The diodes 130, 132, 134 and 136 may be incorporated into a memory array, analogous to the memory array discussed above with reference to FIG. 1.

Figure 26:
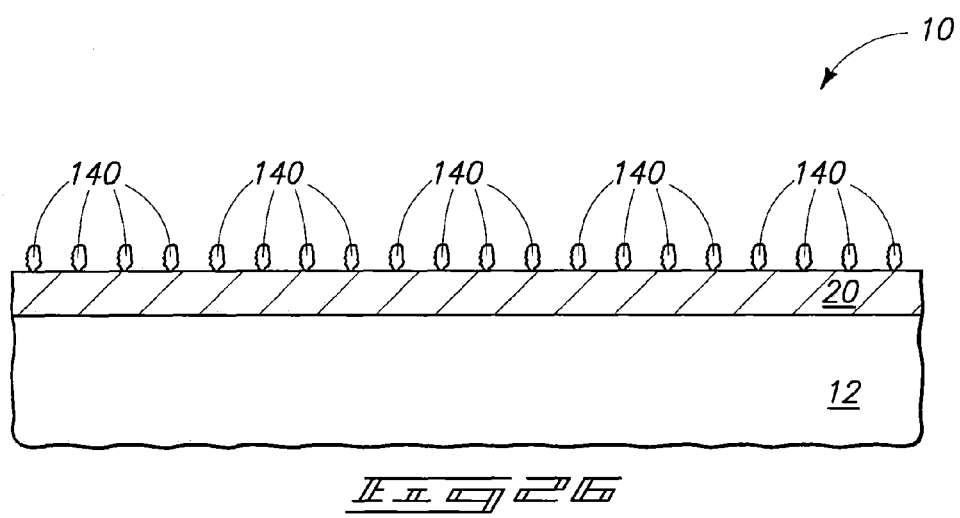
FIGS. 26 and 27 are diagrammatic, cross-sectional views of a portion of a semiconductor construction at various sequential process stages of an example method for forming a layer that comprises support material interspersed in a sacrificial film.

In the example embodiment of FIG. 20, layer 110 is provided as a mixture of particles 112 and sacrificial material 114. In other embodiments, the particles and the sacrificial material may be provided sequentially relative to one another. For instance, FIG. 26 shows construction 10 after spaced apart particles 140 have been provided over the first electrically conductive material 20. The particles 140 may comprise any suitable size and configuration, and in some embodiments may be nanoparticles consisting of metal (for instance, platinum, ruthenium, titanium, etc.), metal-containing compounds (for instance, metal nitride, metal silicides, etc.), or oxide (for instance, silicon dioxide, aluminum oxide, etc.).

Figure 27:
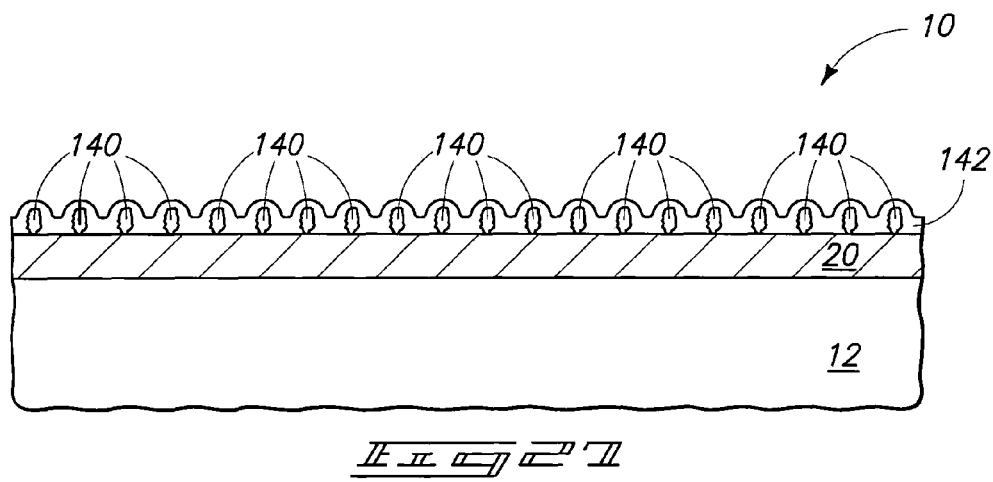

Referring to FIG. 27, sacrificial material 142 is deposited over and between the particles 140. The sacrificial material may comprise any suitable composition or combination of compositions, and may, for example, comprise, consist essentially of, or consist of carbon, silicon dioxide, or organic polymeric materials. In some embodiments, material 142 can be formed to be a conformal, thin film (i.e., less than 50 nanometers thick, or even less than 10 Å thick), and may formed utilizing ALD.

In some embodiments, sacrificial material 142 may be reactive with particles 140 so that at least the outer surfaces of the particles are converted to a new composition through reaction with material 142. In such embodiments, the reaction of the particles with the sacrificial material may occur during the deposition of the material, or in a separate processing stage after the deposition of the material. The construction 10 of FIG. 27 may be subjected to processing analogous to that discussed above with reference to FIGS. 22-25 to form diodes. If the particles 140 are reacted with sacrificial material 142 to change a composition of the particles, and if such reaction occurs after deposition of material 142, the reaction may be conducted at any suitable processing stage. For instance, the reaction may be conducted prior to the deposition of one or both of materials 27 and 22 (FIG. 22), or after such deposition and prior to the patterning of features 120, 122, 124 and 126 (FIG. 23), or after such patterning and prior to the formation of spacers 28 (FIG. 24).

FIGS. 28-33 illustrate another example method for forming diodes of the type shown in FIG. 3. FIGS. 28-33 will be labeled utilizing numbering identical to that utilized in describing FIG. 3, where appropriate.

Referring to FIG. 28, first conductive material 20 is formed over substrate 12, and a layer 150 is formed over the first conductive material. The layer 150 consists of a block copolymer.

Referring to FIG. 29, self-assembly within the block copolymer of layer 150 forms a repeating pattern of alternating subunits 152 and 154 from the block copolymer. In some embodiments, subunits 152 may correspond to regions of sacrificial material, and subunits 154 may correspond to intervening regions that are between the regions of sacrificial material.

Referring to FIG. 30, dielectric material 27 is formed over layer 150, and the second conductive material 22 is formed over the dielectric material. In some embodiments (not shown), more than one dielectric material may be formed over layer 150. Generally, at least one dielectric material will be formed over layer 150, and the second conductive material 22 will be formed over said at least one dielectric material.

Figure 31:
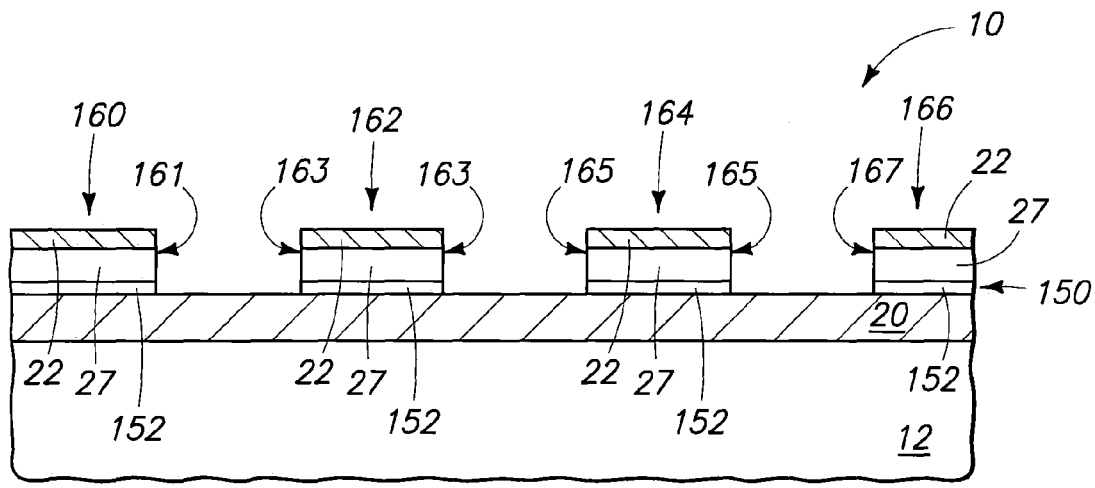

Referring to FIG. 31, layer 150, and materials 27 and 22, are together patterned into a plurality of spaced apart features 160, 162, 164 and 166. The formation of the spaced apart features removes subunits 154 of layer 150, while leaving the subunits 152. The spaced apart features may be formed with any suitable processing. In some embodiments, a photolithographically-patterned mask (not shown) may be formed over the material 22, a pattern transferred from the mask into layer 150 and materials 22 and 27 with one or more suitable etches, and then the mask removed to leave the construction shown in FIG. 15. The etching may selectively remove subunit 154 relative to subunit 152. In some embodiments, the subunits 154 may be removed prior to formation of materials 22 and 27, and the patterning of features 160, 162, 164 and 166 may then comprise only removal of materials 22 and 27 to create the spaces between the features.

The spaced apart features 160, 162, 164 and 166 each comprises a pair of opposing sidewalls (although only one of the sidewalls of each of features 160 and 166 is illustrated in the view of FIG. 31); with the sidewalls of features 160, 162, 164 and 166 being labeled 161, 163, 165 and 167, respectively.

Figure 32:
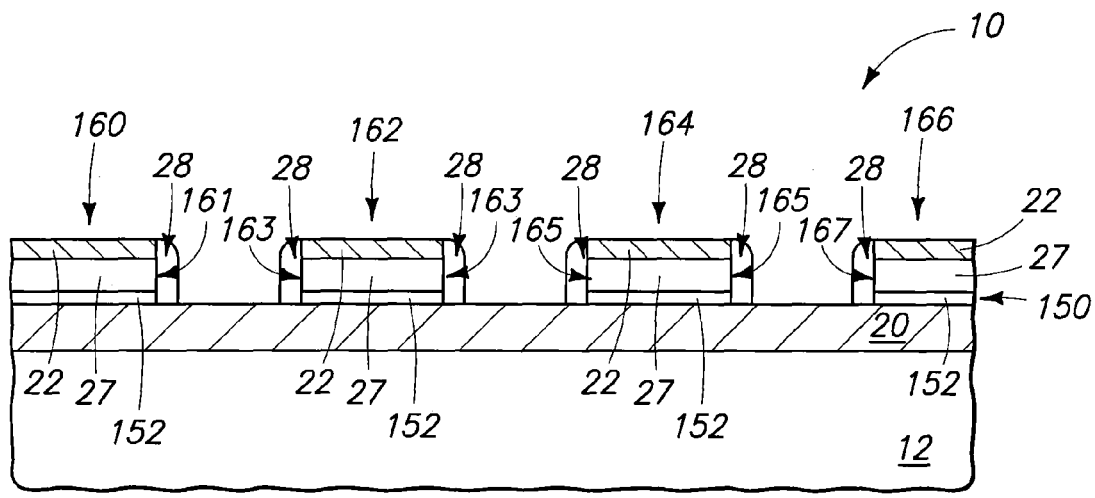

Referring to FIG. 32, spacers 28 are formed along sidewalls 161, 163, 165 and 167. The spacers may be formed with any suitable processing, such as, for example, processing analogous to that discussed above with reference to FIGS. 8 and 9 for formation of spacers 64, 66, 68 and 70.

Figure 33:
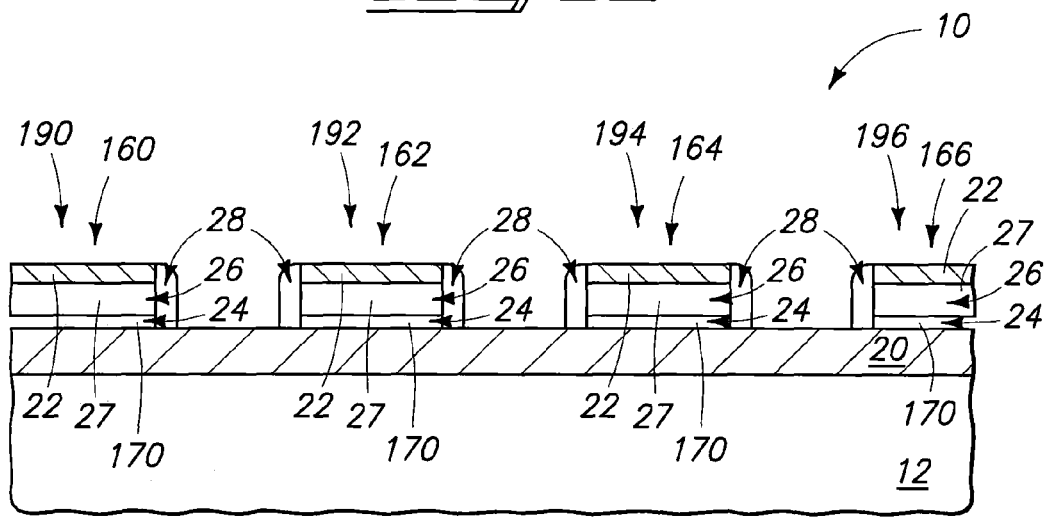

Referring to FIG. 33, subunits 152 (FIG. 32) are removed. The removal of the subunits 152 creates voids (or gaps) 170 under dielectric material 27. The features 160, 162, 164 and 166 may comprise open ends analogous to the open ends of features 54, 56, 58 and 60 shown in FIG. 10, and the removal of the subunits 152 may be accomplished by introducing etchant from such open ends utilizing processing analogous to that discussed above with reference to FIGS. 9-11.

The conductive materials 20 and 22, together with gaps 170 and dielectric material 27, correspond to a plurality of diodes 190, 192, 194 and 196 supported by substrate 12. The gaps 170 may be considered to be comprised by the first dielectric region 24 that was discussed above with reference to FIG. 3, and dielectric material 27 may be considered to be comprised by the second dielectric region 26 that was discussed above with reference to FIG. 3. The diodes 190, 192, 194 and 196 may be incorporated into a memory array, analogous to the memory array discussed above with reference to FIG. 1.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a diode, comprising:
   forming a stack over a first conductive material; the stack including, in ascending order from the first conductive material, a sacrificial material, at least one dielectric material, and a second conductive material; the stack having a pair of opposing sidewalls;
   forming spacers along the opposing sidewalls;
   after forming the spacers, removing an entirety of the sacrificial material to leave a gap between the first conductive material and the at least one dielectric material; and wherein the first conductive material, second conductive material, at least one dielectric material, and gap are together comprised by a diode.

2. The method of claim 1 wherein the sacrificial material comprises carbon, and wherein the removal of the sacrificial layer comprises utilization of an $O_2$ plasma.

3. The method of claim 1 wherein the sacrificial material comprises silicon dioxide, and wherein the removal of the sacrificial layer comprises utilization of hydrofluoric acid.

4. The method of claim 1 wherein the sacrificial material is formed utilizing atomic layer deposition, and is formed to a thickness of less than or equal to about 10 Å.

5. A method of forming a plurality of diodes, comprising:
forming a plurality of spaced apart features over a first conductive material; individual features including, in ascending order from the first conductive material, a sacrificial material, at least one dielectric material, and a second conductive material; each of the features having sidewalls that include segments comprising the sacrificial material, at least one dielectric material, and second conductive material, respectively;
forming spacers along the sidewalls of the features;
after forming the spacers, removing an entirety of the sacrificial material from the features; and
wherein the features having the sacrificial material removed therefrom, together with the first conductive material, are comprised by a plurality of diodes.

6. The method of claim 5 wherein the forming of the features comprises:
forming a layer of block copolymer over the first conductive material;
inducing self-assembly of the block copolymer to form regions of the sacrificial material alternating with intervening regions that are between the regions of the sacrificial material;
removing the intervening regions to leave the regions of the sacrificial material remaining over the first conductive material;
forming the at least one dielectric material and the second conductive material over the regions of the sacrificial material; and
patterning the at least one dielectric material and the second conductive material to be only over the regions of the sacrificial material.

7. The method of claim 6 wherein the forming of the at least one dielectric material and the second conductive material over the regions of the sacrificial material occurs prior to the removal of the intervening regions, and wherein the patterning of the at least one dielectric material and the second conductive material includes removal of the at least one dielectric material and the second conductive material from over the intervening regions.

8. A method of forming a plurality of diodes, comprising:
forming a sacrificial material over a first conductive material;
forming at least one dielectric material over the sacrificial material;
forming a second conductive material over the at least one dielectric material; the sacrificial material, at least one dielectric material, and second conductive material together forming a stack;
patterning the stack into a plurality of spaced apart features, each of the features having sidewalls that include segments comprising the sacrificial material, at least one dielectric material, and second conductive material, respectively;
forming spacers along the sidewalls of the features;
after forming the spacers, removing an entirety of the sacrificial material from the features; and
wherein the features having the sacrificial material removed therefrom, together with the first conductive material, are comprised by a plurality of diodes.

9. A method of forming a plurality of diodes, comprising:
forming a layer over a first conductive material;
chemically modifying at least part of the layer; after said modification, the layer comprising supports interspersed in sacrificial material;
forming overlying materials across the layer, the overlying materials including at least one dielectric material, and a second conductive material over the at least one dielectric material;
patterning the layer and overlying materials into a plurality of spaced apart features;
removing an entirety of the sacrificial material while leaving the supports to at least partially support the overlying materials; and
wherein the features having the sacrificial material removed therefrom, together with the first conductive material, comprise a plurality of diodes.

10. The method of claim 9 wherein:
the layer comprises particles dispersed in the sacrificial material;
the particles comprise a first composition; and
wherein the chemical modification comprises reaction of at least the surfaces of the particles with the sacrificial material to convert the surfaces to a second composition which is different from the first composition.

11. The method of claim 10 wherein the second composition is electrically insulative.

12. The method of claim 10 wherein the first composition is electrically conductive, and wherein the second composition is electrically insulative.

13. The method of claim 10 wherein the first composition consists of one or more metals, wherein the sacrificial material comprises oxygen, and wherein the second composition consists of one or more metal oxides.

14. The method of claim 13 wherein the second composition consists of one or more of ruthenium oxide, titanium oxide and platinum oxide.

15. The method of claim 10 wherein the first composition consists of one or more metals, wherein the sacrificial material comprises silicon, and wherein the second composition consists of one or more metal silicides.

16. The method of claim 15 wherein the second composition consists of one or more of ruthenium silicide, titanium silicide and platinum silicide.

17. The method of claim 9 wherein the layer comprises a block copolymer, and wherein the chemical modification comprises self-assembly of the copolymer to subdivide the layer amongst two or more types of compositions; at least one of said types of compositions being the supports, and at least one of said types of compositions being the sacrificial material.

18. The method of claim 9 wherein the chemical modification occurs before the formation of any of the overlying materials.

19. The method of claim 9 wherein the chemical modification occurs after the formation of at least one of the overlying materials.

20. The method of claim 9 wherein the chemical modification occurs before the patterning.

21. The method of claim 9 wherein the chemical modification occurs after the patterning.

22. The method of claim 9 wherein the features have sidewalls, and further comprising forming anisotropically etched spacers along the sidewalls.

23. The method of claim 22 wherein the spacers are formed after the removal of the sacrificial material.

24. The method of claim 22 wherein the spacers are formed prior to the removal of the sacrificial material.

25. The method of claim 22 wherein the spacers are formed after the chemical modification.

26. The method of claim 22 wherein the spacers are formed prior to the chemical modification.

27. A method of forming a plurality of diodes, comprising:
   forming a plurality of spaced-apart particles over a first conductive material;
   forming a film over and between the spaced-apart particles;
   chemically modifying at least the outer surfaces of the particles by reaction of said outer surfaces with the film;
   forming materials overlying the film, the overlying materials including at least one dielectric material, and a second conductive material over the at least one dielectric material;
   removing an entirety of the film to leave the chemically-modified particles to at least partially support the overlying materials;
   patterning the overlying materials into a plurality of spaced apart features; and
   wherein the features, together with the first conductive material, comprise a plurality of diodes.

28. The method of claim 27 wherein the chemical modification occurs during formation of the film.

29. The method of claim 27 wherein the chemical modification occurs after formation of the film.

30. The method of claim 27 wherein the patterning of the overlying materials occurs prior to the removing of the film, and wherein the film is patterned during the patterning of the overlying materials.

31. The method of claim 27 wherein the patterning of the overlying materials occurs after the removing of the film.

32. The method of claim 27 wherein the chemical modification converts at least the surfaces of the particles from an electrically conductive composition to an electrically insulative composition.

33. The method of claim 32 wherein the electrically conductive composition consists of one or more metals, and wherein the electrically insulative composition consists of one or more metal oxides.

34. The method of claim 27 wherein the chemical modification converts at least the surfaces of the particles from a metal to a metal silicide.

35. The method of claim 34 wherein the metal silicide consists of one or more of ruthenium silicide, titanium silicide and platinum silicide.

* * * * *